(12) United States Patent
Antoniou et al.

(10) Patent No.: US 8,970,016 B2
(45) Date of Patent: Mar. 3, 2015

(54) SEMICONDUCTOR DEVICE

(75) Inventors: Marina Antoniou, Cambridge (GB);
Florin Udrea, Cambridge (GB);
Elizabeth Kho Ching Tee, Sarawak
(MY); Steven John Pilkington, Sarawak
(MY); Deb Kumar Pal, Sarawak (MY);
Alexander Dietrich Hölke, Sarawak
(MY)

(73) Assignee: X-FAB Semiconductor Foundries AG
(DE)

( * ) Notice: Subject to any disclaimer, the term of this patent is extended or adjusted under 35 U.S.C. 154(b) by 0 days.

(21) Appl. No.: 13/486,614

(22) Filed: Jun. 1, 2012

(65) Prior Publication Data

US 2013/0320511 A1 Dec. 5, 2013

(51) Int. Cl.
*H01L 29/02* (2006.01)
(52) U.S. Cl.
USPC ........................................................ 257/655
(58) Field of Classification Search
CPC ............ H01L 29/0634; H01L 29/7811; H01L 29/0619; H01L 29/1095; H01L 29/66712; H01L 29/7802
USPC .................. 257/329, 341, 288, 655
See application file for complete search history.

(56) References Cited

U.S. PATENT DOCUMENTS

| 2006/0033153 | A1 | 2/2006 | Onishi et al. |
| 2008/0079122 | A1 | 4/2008 | Zhu et al. |
| 2008/0290403 | A1* | 11/2008 | Ono et al. ..................... 257/329 |
| 2010/0123171 | A1 | 5/2010 | Yang et al. |
| 2010/0252883 | A1 | 10/2010 | Chen |
| 2011/0073904 | A1 | 3/2011 | Ashida et al. |

FOREIGN PATENT DOCUMENTS

| WO | 2010/133525 | 11/2010 |
| WO | 2010/133923 | 11/2010 |

OTHER PUBLICATIONS

International Search Report and Written Opinion, International Application No. PCT/EP2013/061049, 11 pages (Aug. 20, 2013).

* cited by examiner

*Primary Examiner* — Whitney T Moore
(74) *Attorney, Agent, or Firm* — Thompson Hine L.L.P.

(57) ABSTRACT

A semiconductor device including a p or p+ doped portion and an n or n+ doped portion separated from the p or p+ doped portion by a semiconductor drift portion. The device further includes at least one termination portion provided adjacent to the drift portion. The at least one termination portion comprises a Super Junction structure.

26 Claims, 16 Drawing Sheets

SEMICONDUCTOR DEVICE

The present invention relates to the field of semiconductor devices, more specifically but not restricted to, high voltage semiconductor devices. The invention finds particular application in lateral high voltage devices in thick-film SOI power integrated circuit technologies.

BACKGROUND

High voltage (HV) semiconductor devices such as diodes, transistors and insulated gate bipolar transistors usually include doped semiconductor areas so as to define a p-n junction. A p-n junction is one of the basic building blocks of semiconductor technology. In HV applications, which, in some cases, require the handling of voltages of approximately 60V and higher, the devices usually contain a dedicated pn junction, which depletes in the off-state and supports the off-state voltage, i.e. the depleted region electrically isolates the p-doped region and the n-doped region from one another. This region is called "drift region", "lowly-doped region" or "voltage supporting region".

Alternatively, the drift region can be replaced by alternating p and n highly doped layers that under mutual charge compensation can completely deplete in the off-state and support a high voltage across the device. These types of configurations are widely known as RESURF or SuperJunction.

The high voltage device is embedded in a semiconductor substrate or material, which is normally held at low voltage. For this reason high voltage semiconductor devices usually also contain isolation regions, which electrically isolate the device from the surrounding substrate. These isolation regions help to ensure that the high voltages are contained within the high voltage device and that the high voltage does not negatively impact the surrounding devices and package.

For lateral high voltage devices such as LDMOS, LIGBT, the lightly doped/SJ drift region should not only be isolated from the surrounding substrate but should also be terminated in such a way that the carefully engineered field or potential distribution is not altered (or that any such alteration is kept sufficiently insignificant), so that as much as possible of the full voltage rating of the HV device can be realized. In order to be effective these isolation areas should have a higher voltage carrying capability than the interior devices. In this way the voltage rating is given by the interior device only.

Electrical isolation can be achieved by dielectric materials or by reverse-biased pn-junctions. Under Dielectric Isolation, vertical isolation can be realized by using SOI (Silicon on Insulator) material, which contains a BOX (Buried Oxide) layer between the active top layer and the handle wafer substrate. Lateral isolation can be achieved by forming oxide filled trenches or field oxide reaching all the way down to the BOX.

Junction isolation normally utilises similar lowly-doped regions as the drift region of the HV device. The inventors have appreciated that the presence of a Super Junction in the drift region imposes additional challenges on the design of the device isolation.

Whether or not a Super Junction structure is present in the drift region, the inventors have appreciated that the presence of a Super Junction structure in the termination region may be useful in some devices. The presence of a Super Junction structure in the termination region may for example help to avoid breakdown in certain regions of the device, such as at an edge of the p or n-doped regions referred to above.

WO2010133923 and WO2010133525 disclose p-n junctions. Both publications are hereby incorporated by reference for all purposes in their entirety.

SUMMARY

According to one aspect, the present invention is a semiconductor device including a p or p+ doped portion and an n or n+ doped portion separated from the p or p+ doped portion by a semiconductor drift portion. The device further includes at least one termination portion provided adjacent to the drift portion. The at least one termination portion comprises a Super Junction structure.

BRIEF DESCRIPTION OF THE DRAWINGS

Some embodiments of the invention will now be described by way of example only and with reference to the accompanying drawings, in which.

DETAILED DESCRIPTION

Figure 1:
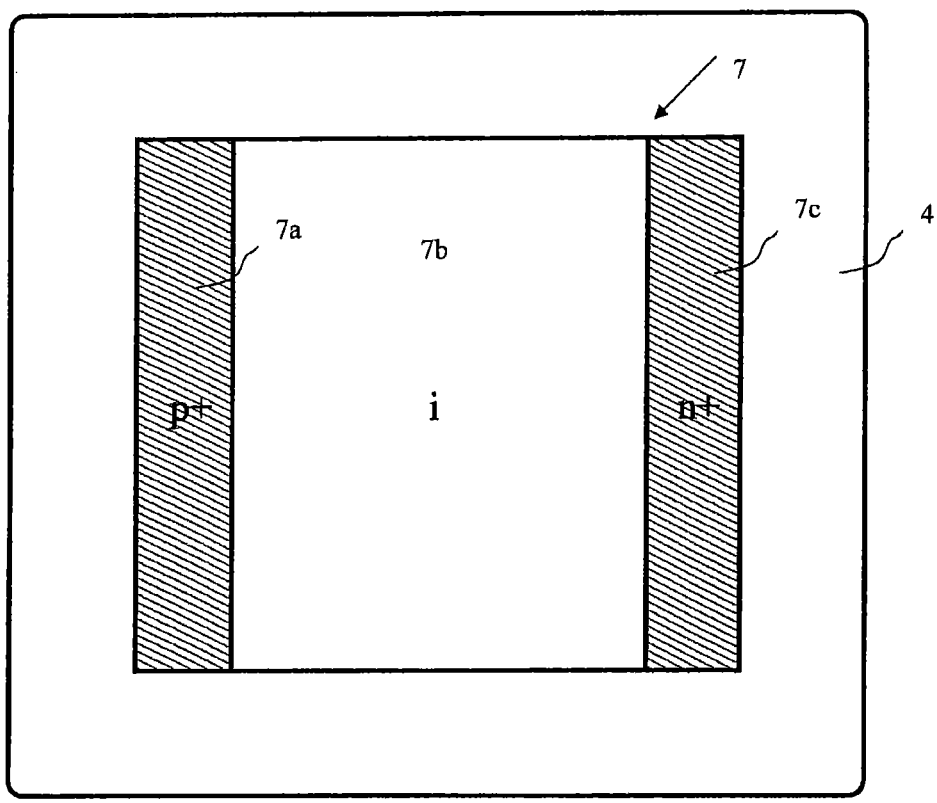
FIG. 1 shows a top view of a PIN junction.

FIG. 1 shows a top view of a PIN junction 7. The junction may be a high voltage junction. The junction 7 shown in FIG. 1 has three portions or regions: a p or p+ doped portion or region 7a, a drift portion or region 7b (also referred to as intrinsic region) and a n+ or n doped portion or region 7c. The drift region 7b may be made from lowly doped semiconductor material and separates the p and n doped portions 7a and 7c. FIG. 1 is a theoretical illustration since in this example the junction is suspended in air or vacuum 4.

Figure 2:
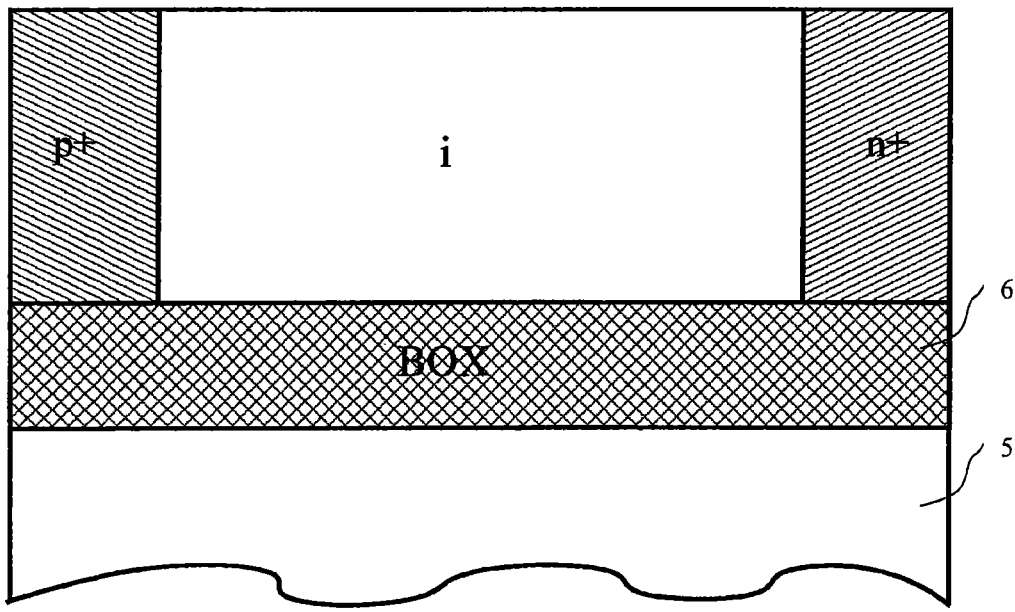
FIG. 2 shows the junction of FIG. 1 in cross section.

FIG. 2 shows the junction 7 of FIG. 1 in cross section. The structure shown is vertically insulated from a handle wafer 5 using dielectric isolation (BOX, bottom oxide) 6.

Figure 3:
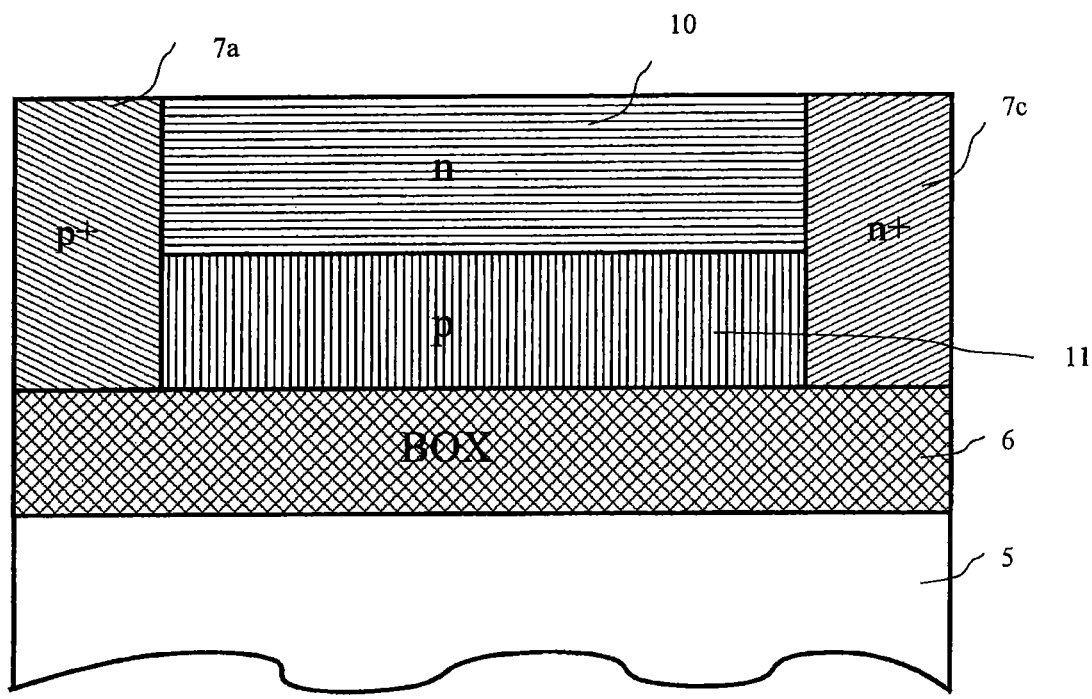
FIG. 3 shows a cross-sectional view of a Super Junction diode.

FIG. 3 shows a cross-sectional view of a Super Junction diode. The structure is similar to that of FIG. 2. However, the intrinsic region 7b is replaced by alternating n and p layers, n layer 10 and p layer 11. In the off-state these layers 10 and 11 may substantially completely deplete. Whilst n layer 10 is shown above p layer 11, it would also be possible to arrange these layers in the opposite way.

Figure 4:
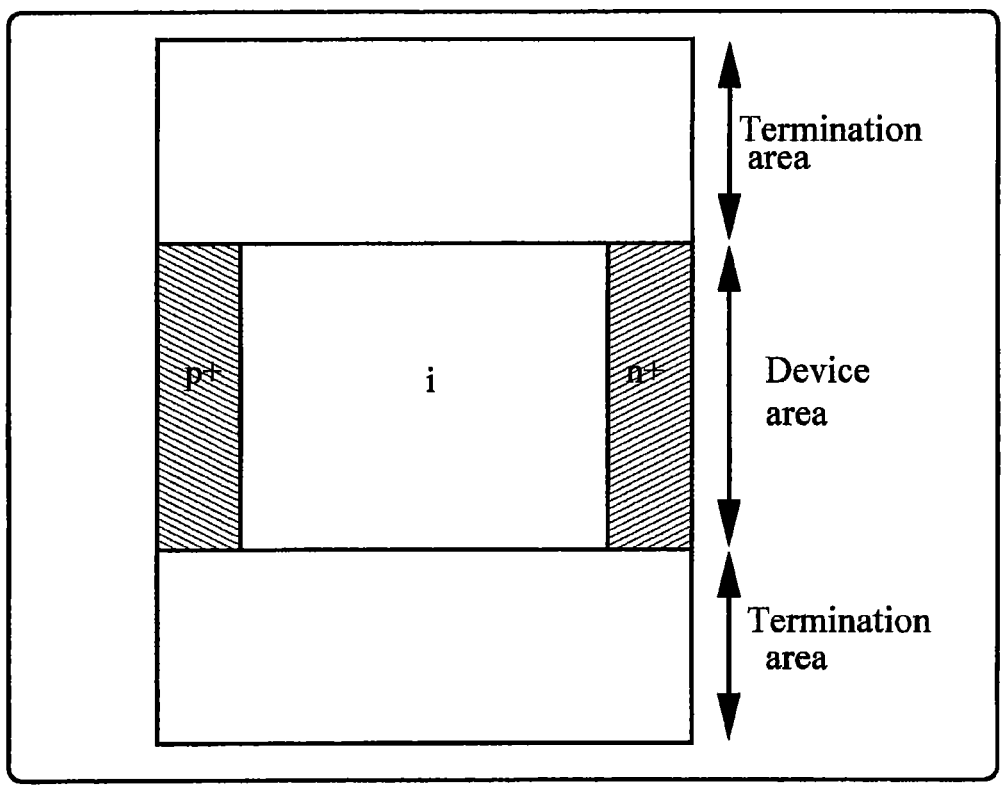
FIG. 4 shows a top view of a further PIN junction.

FIG. 4 shows a top view of a further PIN junction. The drift region separates the p and n doped portions. The drift region and the p and n doped portions form a device area. The device area is surrounded by silicon termination/isolation area, at least on two opposite sides (in a direction generally perpendicular to a line (not shown) which goes through the middle of the p and n doped portions).

Figure 5:
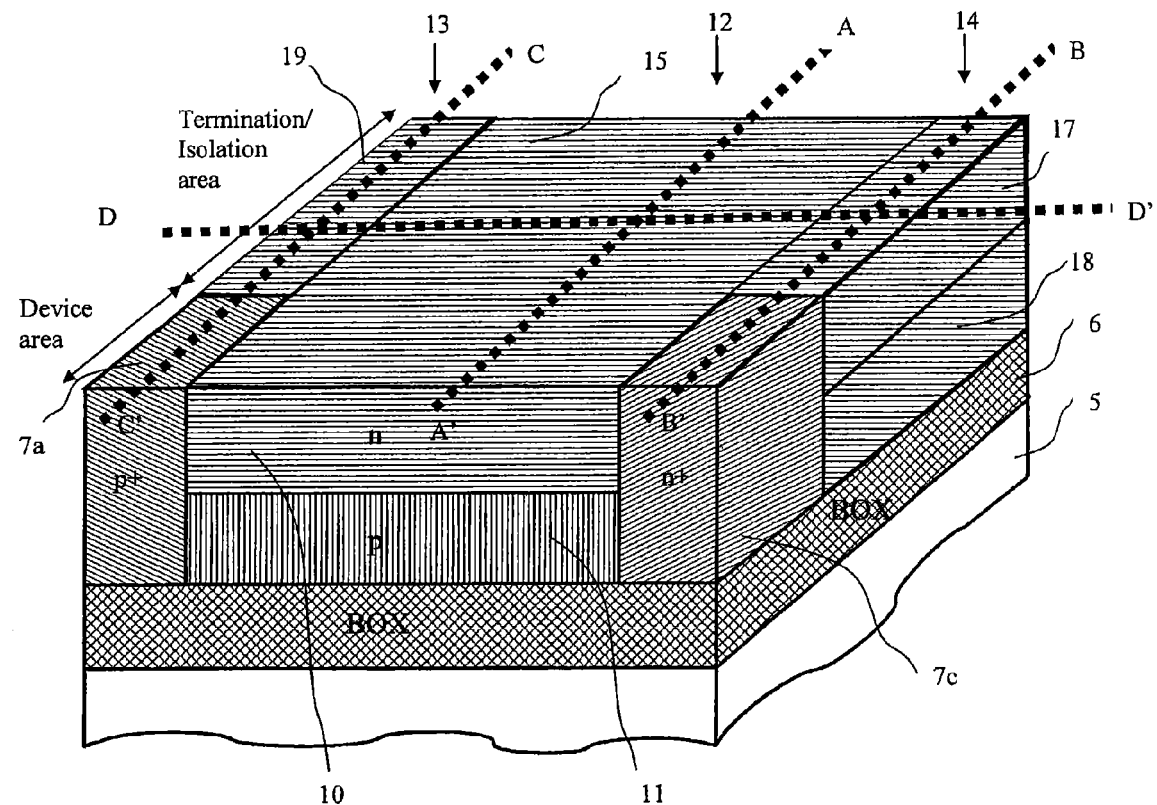
FIG. 5 shows a perspective view of a junction according to an embodiment of the present invention.
Figure 6:
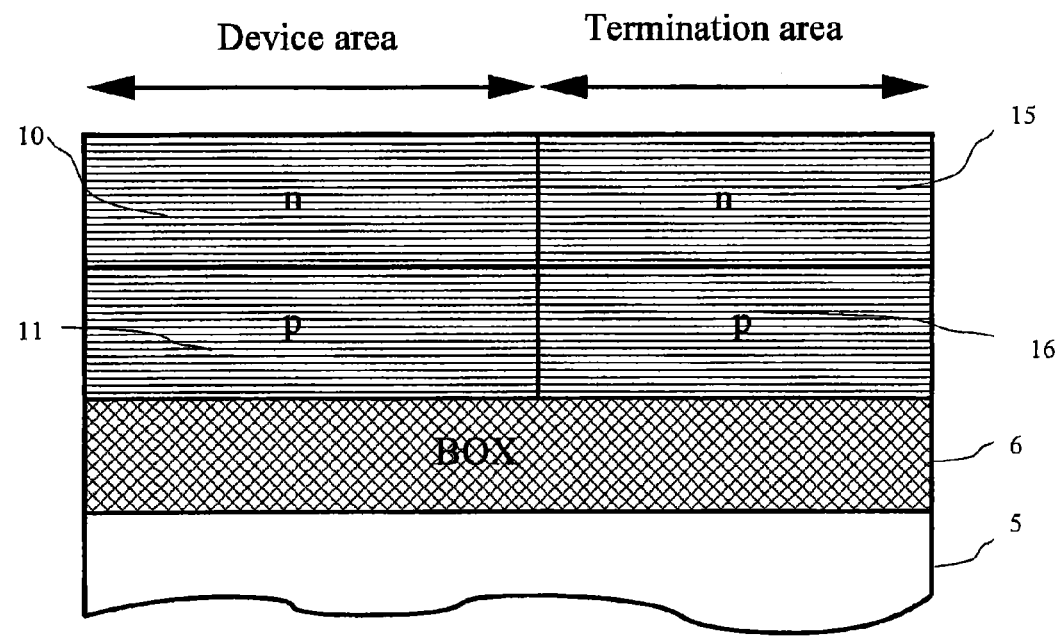
FIG. 6 shows a cross sectional view of FIG. 5 along line AA'.

FIG. 5 shows a perspective view of a junction according to an embodiment of the present invention. Only one termination area is shown in addition to the device area, but it will be understood that a further termination area is normally provided opposite to the termination area which is shown, similar to the junction shown in FIG. 4. In this structure the drift region are comprised of the p/n super junction layers 10 and 11. The termination area comprises three regions, a central region 12 and outer regions 13 and 14. Central region 12 is generally in line with, and thus associated with, drift region 7b, and outer regions 13 and 14 are generally in line with, and thus associated with, doped portions 7a and 7c respectively. Similar to drift region 7b, the termination region also comprises a super junction structure. As regards central region 12, only the top layer 15 is referenced in FIG. 5 (the bottom layer 16 is shown in FIG. 6). The bottom layers 11 and 16 respectively of the drift region and the central region 12 may be formed as one continuous/homogeneous layer in the same processing steps, and the top layers 10 and 15 respectively of the drift region and the central region 12 may also be formed as one continuous/homogeneous layer in the same processing steps.

The outer regions 13 and 14 also comprise a super junction structure. As shown in FIG. 5, outer region 14 has n doped (top) layer 17 on p doped (bottom) layer 18 (and correspondingly for outer region 13). Again, these may be formed as one continuous/homogeneous layer with the central region 12. Whilst a line is shown in FIG. 5 as separating outer regions 13 and 14 from central region 12, this is primarily shown for illustration purposes. The regions may be formed in a continuous/homogeneous manner or as distinct regions.

The vertical isolation is achieved by the presence of BOX layer 6.

FIG. 6 shows a cross sectional view of FIG. 5 along line AA'. The termination area is comprised of the p/n superjunction bottom and top layers 16 and 15 next to bottom and top drift portion layers 11 and 10, effectively as an extension of the drift region 7b in the 3rd dimension (i.e. in the direction of line AA'). FIG. 6 shows the device area and termination area cross section away from the high and low sides of the device.

Several variants of the embodiment shown in FIG. 5 will now described. The following text refers to FIG. 5, but it will be understood that these variants differ from the embodiment of FIG. 5. The description of these variants will focus on the differences to what is shown in FIG. 5, and it will be understood that features of the variants which are not specifically explained may be the same as features of the FIG. 5 embodiment.

Variant (i): Junction Termination Extension Isolation

Figure 7:
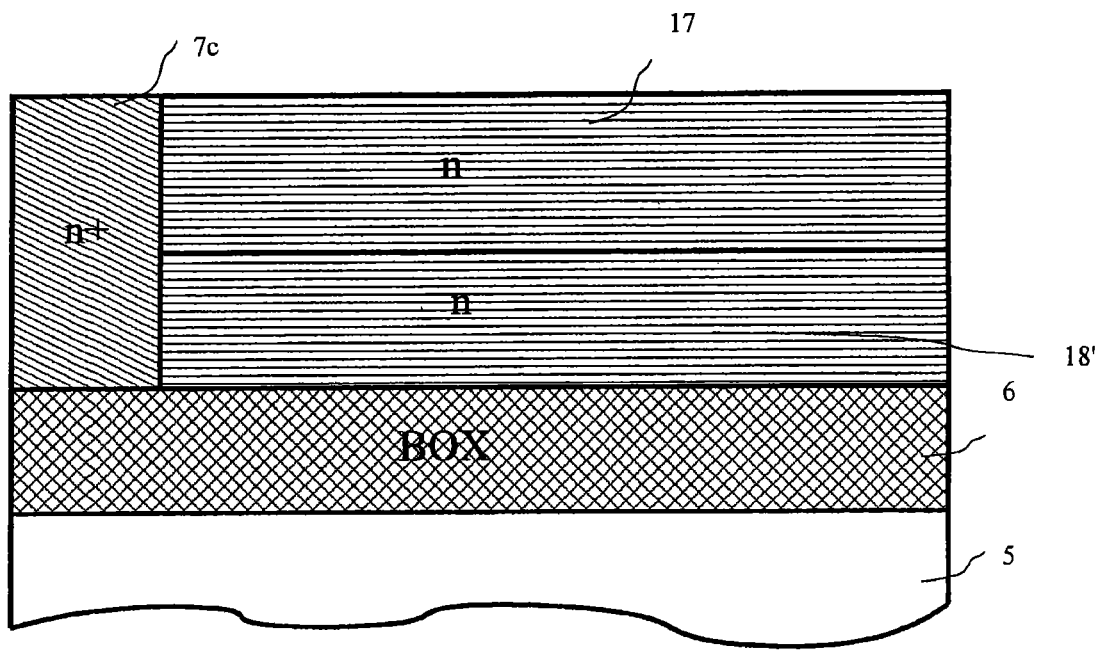
FIG. 7 shows a cross sectional view along line BB' of FIG. 5.
Figure 8:
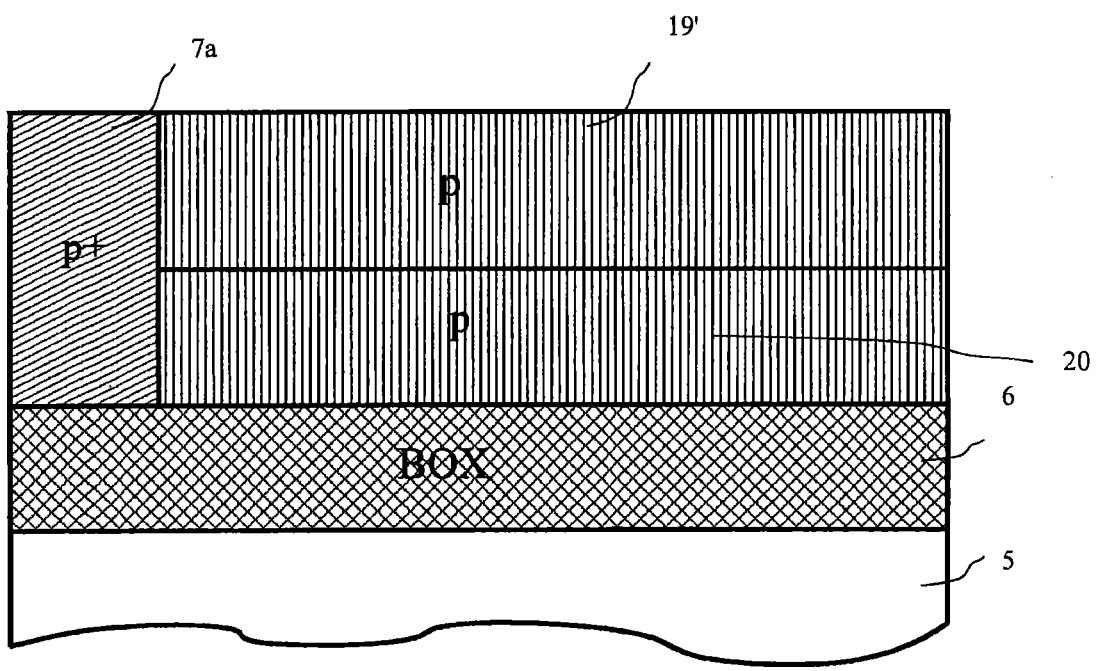
FIG. 8 shows a cross sectional view along line CC' of FIG. 5.
Figure 9:
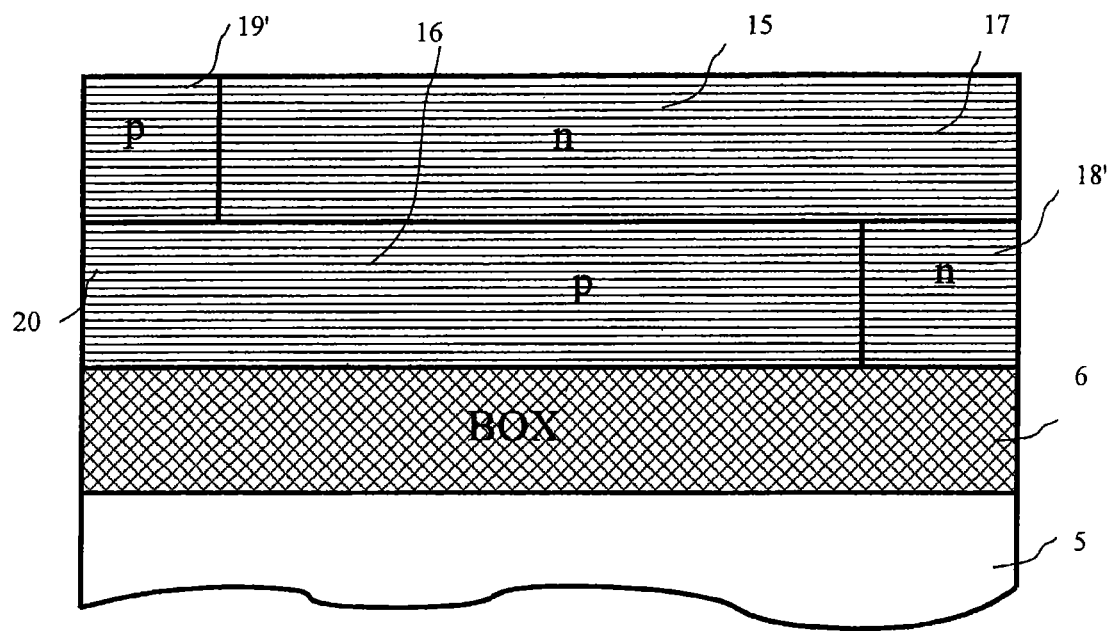
FIG. 9 shows a cross sectional view along line DD' of FIG. 5.

FIGS. 7-9 show different cross sectional views of a variant of FIG. 5.

FIG. 7 shows a cross sectional view along line BB' of FIG. 5. However, the p layer 18 of the super junction structure of outer region 14 is "replaced" with a further n layer 18'. The term "replaced" (as used in connection with this and other variants) is merely used to illustrate the difference to the FIG. 5 embodiment. It does not imply that a device as per FIG. 5 is initially formed and that p layer 18 is then converted into n layer 18' or removed and then replaced with a fresh n layer 18'. Layers 17 and 18' may have substantially similar properties (doping etc.) and may be formed in separate steps or in the same processing steps.

The superjunction structure in outer region 14 has the effect that the electric field is released at the edge of the n+ portion 7c into the termination region.

FIG. 8 is similar to FIG. 7 and shows a cross sectional view along line CC' of FIG. 5. The n layer 19 (top layer) of the super junction structure in outer region 13 is replaced with a further p layer 19'.

The superjunction structure in outer region 13 has the effect that the electric field is released at the edge of the p+ portion 7a into the termination region.

FIG. 9 shows a cross sectional view along line DD' of FIG. 5. The specific structure shows the junction termination extension at the left and right edges. Bottom layer 18' of outer region 14 may be formed continuous/homogeneous with top layer 17 and 15 respectively of outer region 14 and central region 12, and top layer 19' may be formed continuous/homogeneous with bottom layer 20 and 16 respectively of outer region 13 and central region 12.

The outer regions 13 and 14 are not necessarily aligned respectively with the doped p+ and n+ portions 7a and 7c. For example, n layer 18' is not necessarily aligned with n+ doped portion 7c, and p layer 19' is not necessarily aligned with p+ doped portion 7a, i.e. the dimensions of n layer 18' and p layer 19' in a direction parallel to line DD' may be different respectively from the dimensions of n+ doped portion 7c and p+ doped portion 7a in that direction.

Variant (ii): Islands Isolation

Figure 10:
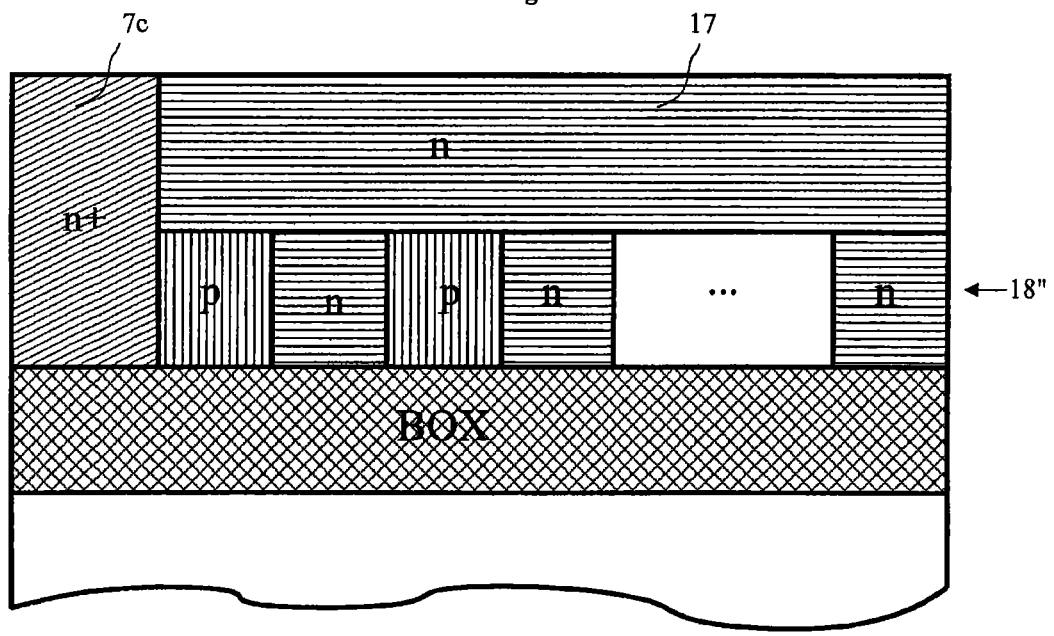
FIG. 10 shows a cross sectional view of a further embodiment, similar to that of FIG. 7.
Figure 11:
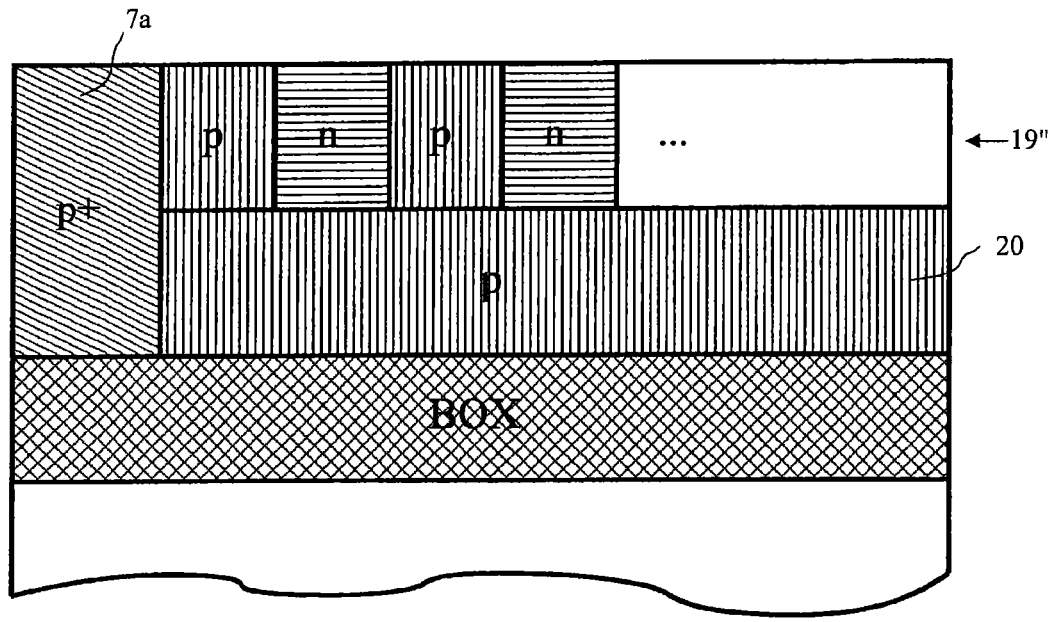
FIG. 11 shows a further cross sectional view of the embodiment of FIG. 10, similar to that of FIG. 8.

FIGS. 10 and 11 show different cross sectional views of a further variant of FIG. 5, respectively along lines BB' and CC'.

FIG. 10 shows a cross sectional view of this further variant. This view is similar to what is shown in FIG. 7. However, with reference to FIG. 5, the p layer 18 of the super junction structure in outer region 14 is replaced by alternating n and p layers or regions. These form an array of "islands" arranged next to each other in the BB' direction. This aims to move points of high electric field away from the interface of the termination region with the device area so as to release the electric field at the edge of the n+ region 7c into the termination region. The islands are collectively referenced as layer 18".

FIG. 11 shows a further cross sectional view of this further variant. This view is similar to what is shown in FIG. 8. However, with reference to FIG. 5, the n layer 19 of the super junction structure in outer region 13 is replaced by alternating n and p layers or regions. These form "islands" arranged next to each other in the CC' direction. These islands are collectively referenced as layer 19". This releases the electric field at the edge of the p+ region 7a into the termination region.

The island layers 18" and 19" are not necessarily aligned with their associated doped portions 7c and 7a respectively. The super junction structure remains at (all) other locations of the termination region.

The electric field distribution may be controlled by the size and spacing of the islands (by the net charge).

According to some embodiments, the island type termination completely depletes before breakdown.

Variant (iii): Field Plates

Figure 12:
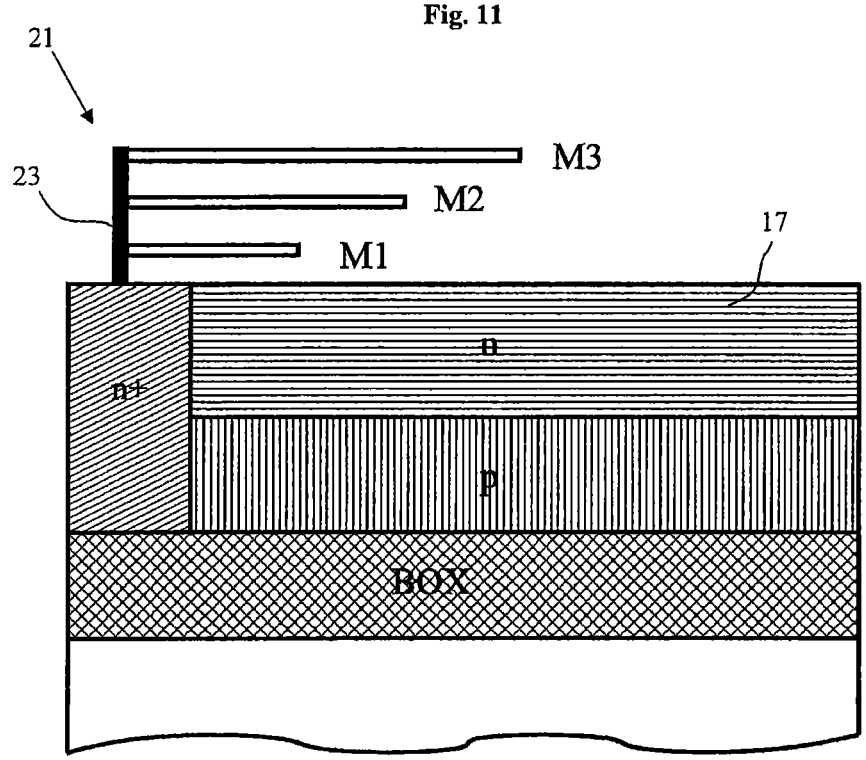
FIG. 12 shows a cross sectional view of a further embodiment, similar to that of FIG. 7.
Figure 13:
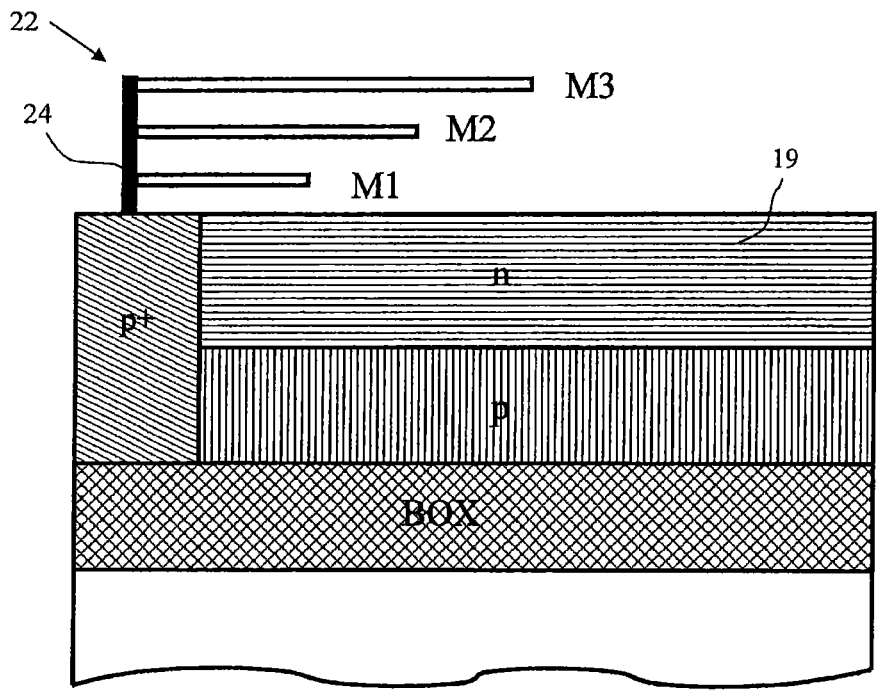
FIG. 13 shows a further cross sectional view of the embodiment of FIG. 12, similar to that of FIG. 8.

FIGS. 12 and 13 show different cross sectional views of a further variant of FIG. 5, respectively along lines BB' and CC'. In this variant, a metal structure, such as one or more field plates, is used to cover at least a portion of the termination region. The high and low sides of the device area sides may thus be better protected from high electric fields.

FIG. 12 shows a cross sectional view of this further variant. This view is similar to what is shown in FIG. 7. However, with reference to FIG. 5, a metal structure 21 is provided. This is in electrical communication, and thus associated, with n+ portion 7c. In certain embodiments the metal structure 21 comprises a portion 23 which extends from the surface of portion 7c. One or more field plates M1 to M3 extend from portion 23, generally parallel to the surface of portion 7c and n layer 17. The field plates overlap with n layer 17. If metal structure 21 comprises more than one field plate then a field plate (M1) which is closer to the surface of n layer 17 would normally be shorter than a field plate (M3) which is further away from the surface of n layer 17. Field plate M3 thus overlaps with n layer 17 to a greater extent than field plate M1.

The surface field plates M1 to M3 are used to help to gradually release the electric field at the edge of the n+ portion 7c into the termination region.

FIG. 13 shows a further cross sectional view of this variant. This view is similar to what is shown in FIG. 8 and shows a metal structure 22 in electrical communication, and thus associated, with p+ portion 7a. Metal structure 22 comprises a portion 24 which extends from the surface of portion 7a. One or more field plates M1 to M3 extend from portion 24, generally parallel to the surface of portion 7a and n layer 19. Metal structure 22 may be constructed similar to metal structure 21. The surface field plates M1 to M3 are used to help to gradually release the electric field at the edge of the p+ portion 7a into the termination region.

The additional metal structure(s) according to this variant may be used in combination with any other embodiment disclosed herein. The Field Plate extension and Islands termination extension combination may further assist in the shaping of the electric field distribution. Metals run from the device area high and low sides towards the termination of the device. The metals extension and dimensions can vary so as to achieve the desired potential lines distribution.

The presence of a Super Junction structure in the termination region may lead to increased field pressure at the edge of the p+ and n+ portions 7a and 7c. The additional metal structure(s) according to this variant may help to release this pressure.

Ring-Type Embodiment

Figure 14:
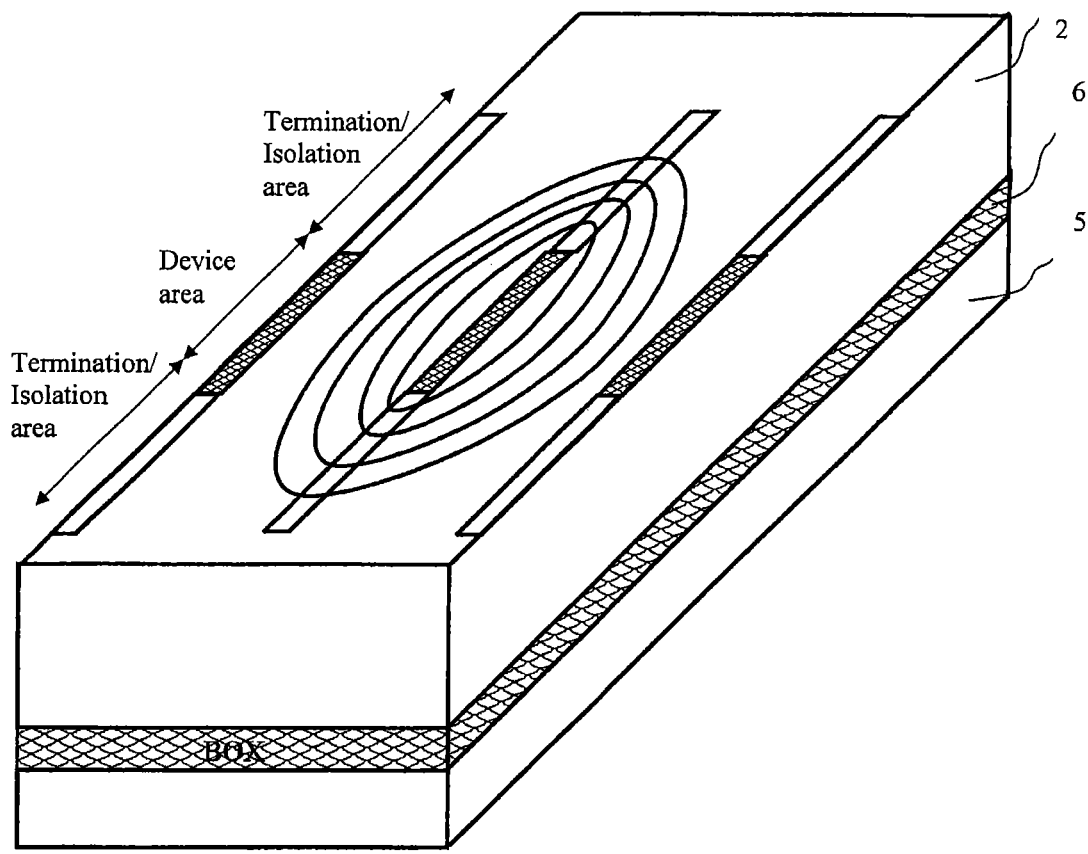
FIG. 14 shows a perspective view of a junction according to a further embodiment of the present invention.

FIG. 14 shows a perspective view of a junction according to a further embodiment. This is again based on the FIG. 5 embodiment. However, the structure differs from what is shown in FIG. 5 in some significant aspects. In particular, the device area and termination regions are formed such that a ring-type structure can be regarded as surrounding one of the doped portions.

Figure 27:
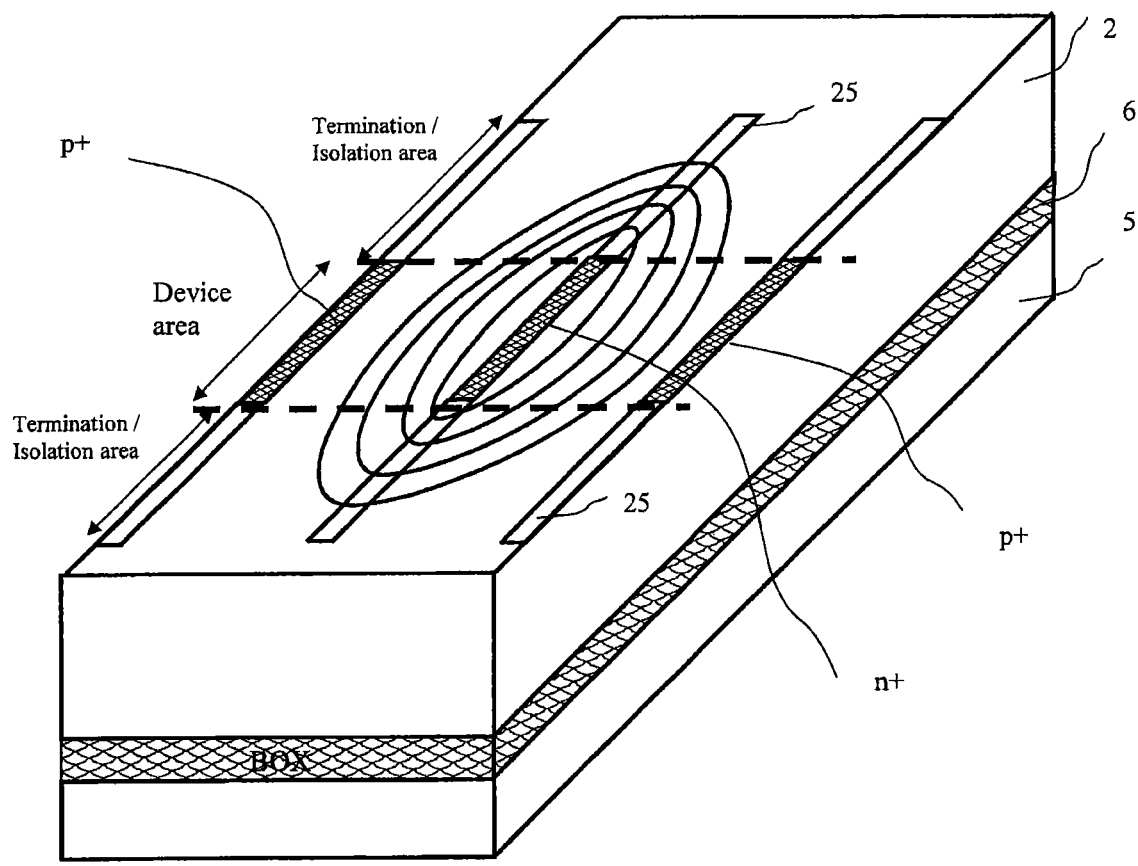
FIG. 27 shows an alternative illustration of the embodiment of FIG. 14.

Some reference lines and numbers are omitted from FIG. 14 for clarity. FIG. 27 is substantially similar to FIG. 14 and includes these reference lines and numbers.

As shown in FIG. 27, the device comprises three doped portions. In the example shown, two p+ doped portions are provided towards the periphery of the device, and one n+ doped portions is provided towards the centre. The doped portions are oblong strips or layers. The main extent of each of these layers runs generally parallel to the main extent of the other two layers. The three doped portions and the drift portion(s) between these form the device area.

Each of the low side p+ and high side n+ implants are surrounded—on two sides—by a portion of the termination region. Portions 25 (two of which are indicated in FIG. 27) can be regarded as an extension of the doped portions on both sides. These portions 25 may be formed in like manner as the corresponding portions 13 and 14 in FIG. 5 and any of its variants. For example, portions 25 may have the island structure as shown in FIGS. 10 and 11 (layers 17 and 18" and layers 19" and 20). In FIG. 27, portions 25 are only indicated on the top surface of the device, but it will be understood that they extend into the device towards the BOX layer 6.

FIGS. 14 and 27 also show the potential lines around the central n+ doped portion during operation.

Although one could regard each termination area (shown above and below the dashed lines in FIGS. 14 and 27) as being split into two parts by the portions 25 on either side of the central n+ doped portion, in the present specification the term "termination area" is mostly used in the singular to refer to both parts collectively. This also applies to other embodiments where the termination area may be regarded as being split into two or more parts. Similar comments apply to the drift portion.

Comb-Type Embodiment

Figure 15:
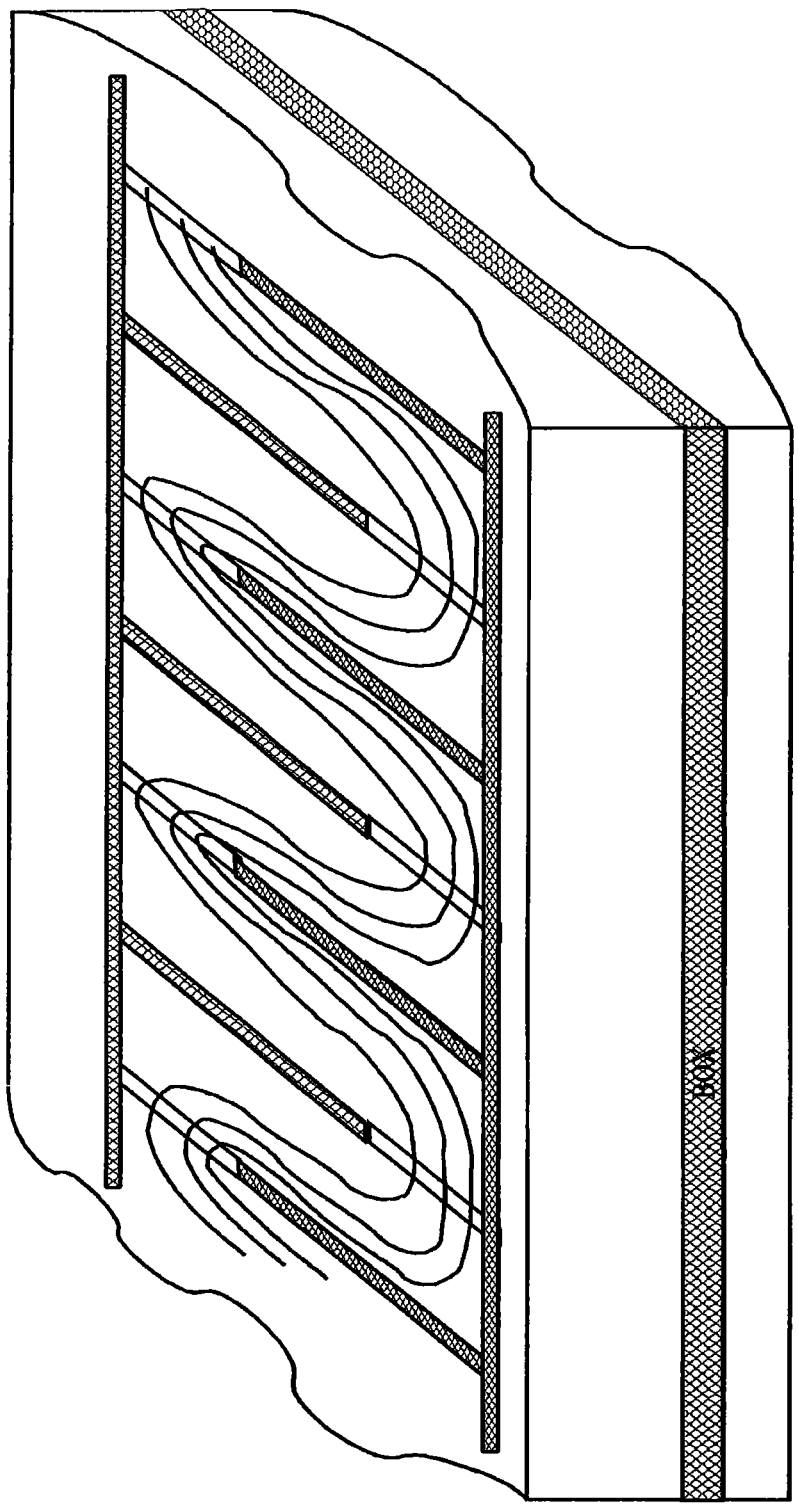
FIG. 15 shows a perspective view of a junction according to a further embodiment of the present invention.

FIG. 15 shows a perspective view of a junction according to a further embodiment. This is again based on the FIG. 5 embodiment. However, the structure differs from what is shown in FIG. 5 in some significant aspects. In particular, the device area and termination regions are formed such that a comb-type structure results.

Figure 28:
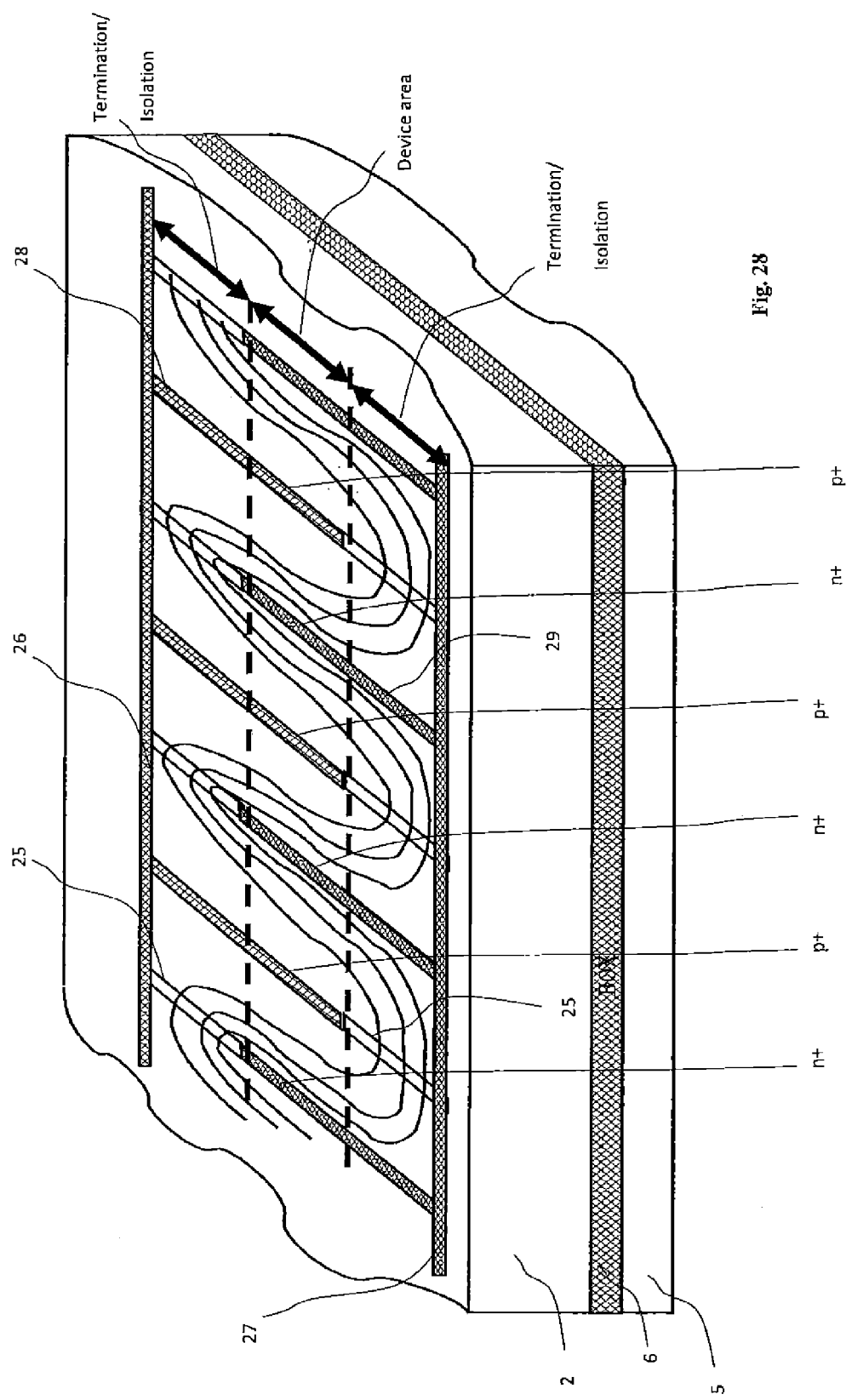
FIG. 28 shows an alternative illustration of the embodiment of FIG. 15.

Reference lines and reference signs are omitted from FIG. 15 for clarity. FIG. 28 is substantially similar to FIG. 15 and includes reference lines and reference signs.

As shown in FIG. 28, the device comprises several n+ and p+ doped portions in a central device area. In the example shown, three p+ doped portions and four n+ doped portions are provided, although more, or less, doped portions are possible. The doped portions are oblong strips or layers. The main extent of each of these strips or layers runs generally parallel to the main extent of the other strips or layers. The doped portions and the drift portion(s) between these form the device area.

Also provided are two connection rails 26 and 27 containing conductive material. The rails may be made from metal. The rails extend along the outer edge of the termination regions. Each doped portion is connected to a respective rail via connection portions 28 and 29 made, for example, from metal, at the surface of the device. The p+ doped portions are connected to rail 26 by means of connection portions 28, and the n+ doped portions are connected to rail 27 by means of connection portions 29. The doped portions and their respective connection portions and rails form a comb structure having a number of "fingers". Since the n+ and p+ doped portions are offset and since they overlap in the device area the two combs form an interlocking comb structure.

As in the FIG. 14/FIG. 27 embodiment, the doped portions are provided with portions 25, which may again be constructed as in the FIG. 14/FIG. 27 embodiment. Although in FIGS. 15 and 28 these portions 25 are illustrated only on one side of each p+ and n+ doped portion, they are in fact present on both sides thereof (under the connection portions 28 and 29. Portions 25 may extend from the doped portions to the rails.

The potential lines across the multi-fingers are also shown. As shown, the potential lines form a meandering pattern around the doped portions. The potential lines cross the area of portions 25.

Figure 16:
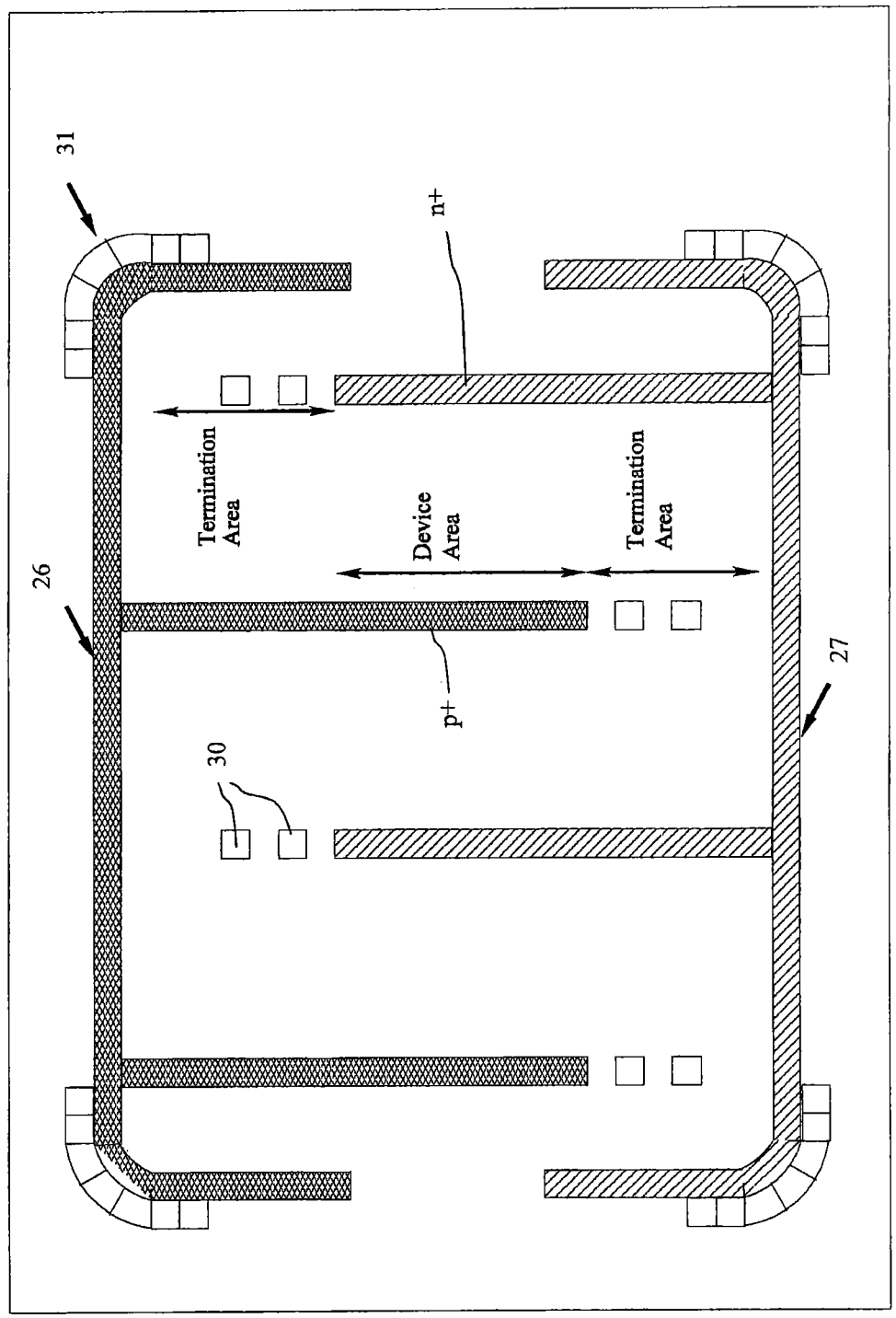
FIG. 16 shows a top view of a junction according to a variant of the junction of FIG. 15.

FIG. 16 shows a top view of a junction according to a variant of the FIG. 15. At the location of portions 25 in FIG. 15/FIG. 28, one or more Super Junction islands 30 are provided. These may be formed in accordance with the SJ islands of FIGS. 10 and 11. In particular, the doping of the islands will depend on the doped portion (p+ and n+) next to which they are located. The SJ islands associated with a particular p+ or n+ doped portion do not extend all the way to the rail (27 or 26 respectively) to which that doped portion is not connected. The SJ islands push areas of high electric field further into the termination region, away from the doped portion.

A separate aspect is also shown in FIG. 16. At their longitudinal ends, the rails "curve inwards" towards the device area so that the end sections of the rails extend generally parallel to the doped portions. Where the rails curve inwards, a plurality of SJ islands 31 surrounds the periphery of the rails. This helps to protect the semiconductor region from high electric field peaks as the metal curvature can induce pressure to these regions. Only one row of SJ islands 31 is arranged along the periphery of each corner of the rails. These islands may again be formed in accordance with the SJ islands of FIGS. 10 and 11, and their doping will again depend on the doped portion (p+ and n+) which is connected to the rail next to which the islands are located.

Figure 17:
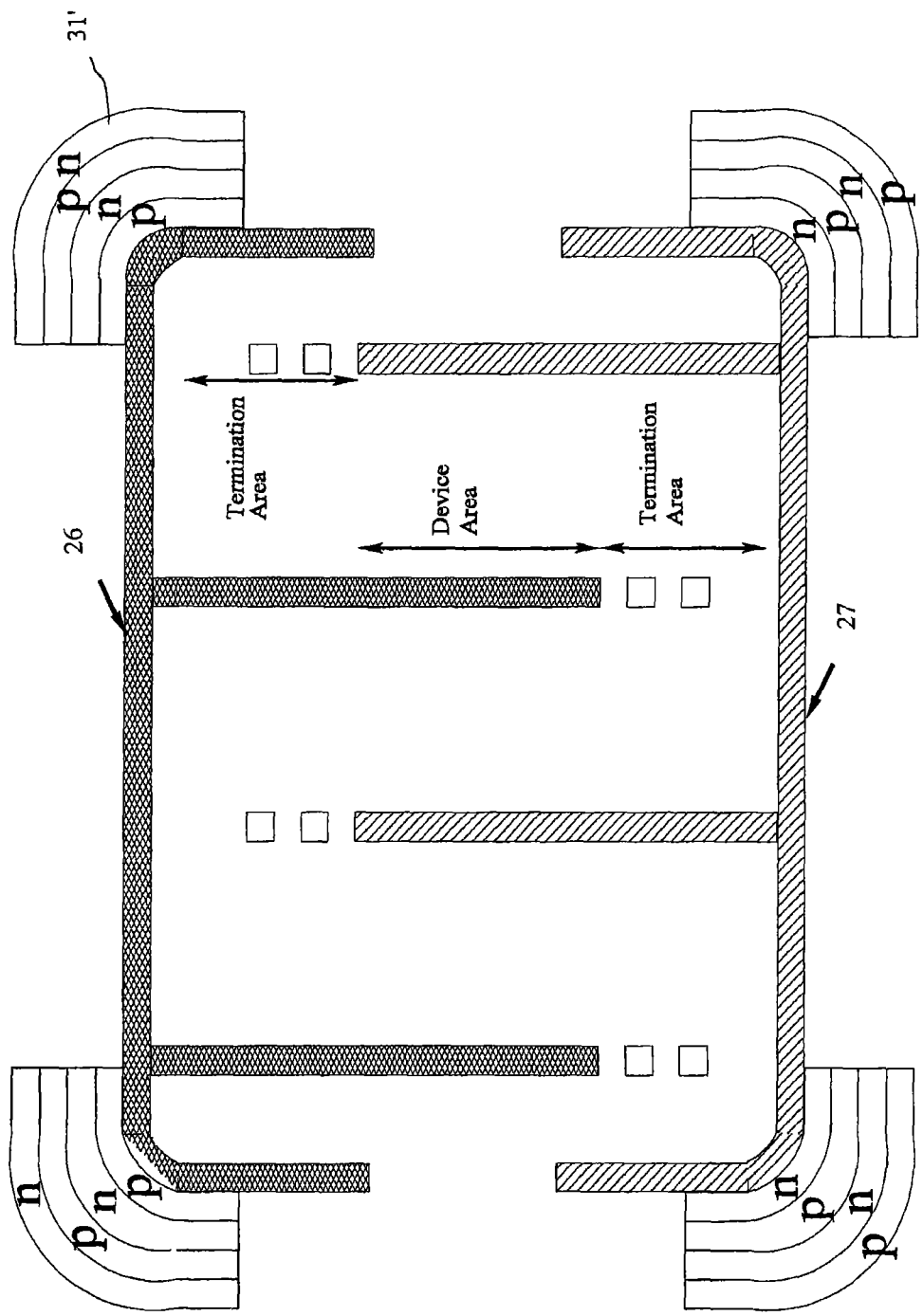
FIG. 17 shows a top view of a junction according to a further embodiment of the present invention.

FIG. 17 shows a top view of a junction according to a further embodiment. This is a variant of the FIG. 16 embodiment, and most features correspond. However, instead of one row of alternating SJ islands 31a plurality of rows of SJ islands 31' are arranged at each corner in such a manner that only one "island" is in direct contact with a respective corner of a rail. The corners of the low side metal rail 26 are directly surrounded only by a p-type SJ island, and this p-type SJ island is in turn surrounded by a n-type SJ island. etc., and vice versa at the corners of the high side metal rail 27. Each SJ island 31' of FIG. 17 is "stretched" when compared with the SJ islands 31 of FIG. 16.

The SJ islands 31 and 31' of FIGS. 16 and 17 may also be formed in accordance with the SJ islands of FIGS. 10 and 11.
Further Embodiments and General Points In all embodiments disclosed herein, the term "superjunction structure" encompasses a structure which has more than two layers. For example, the SJ structure may have three or four layers.

Figure 18:
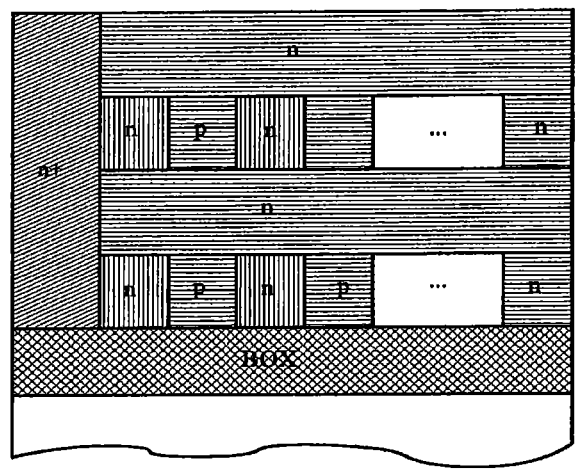
FIG. 18 shows a cross sectional view of a further embodiment, similar to that of FIG. 10.
Figure 19:
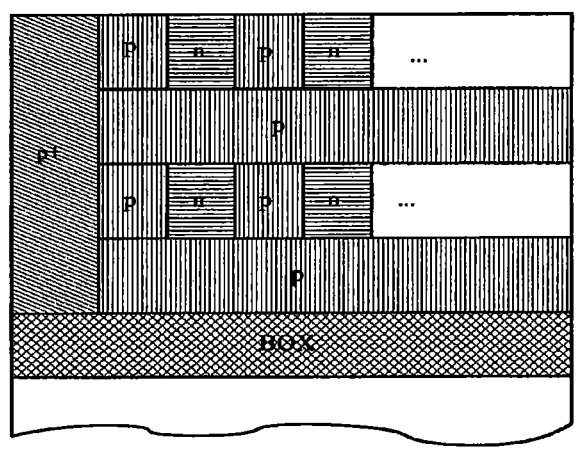
FIG. 19 shows a further cross sectional view of the embodiment of FIG. 18, similar to that of FIG. 11.

FIGS. 18 and 19 show cross sectional views of a further embodiment, similar to those of FIGS. 10 and 11. This illustrates a case where the SJ structure has four layers. FIGS. 18 and 19 respectively show the structure of outer regions 14 and 13. In the example shown, the SJ comprises SJ islands.

Figure 20:
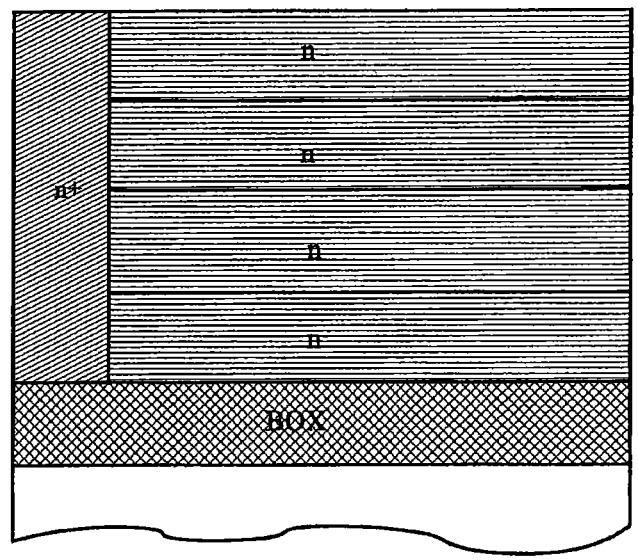
FIG. 20 shows a cross sectional view of a further embodiment, similar to that of FIG. 7.
Figure 21:
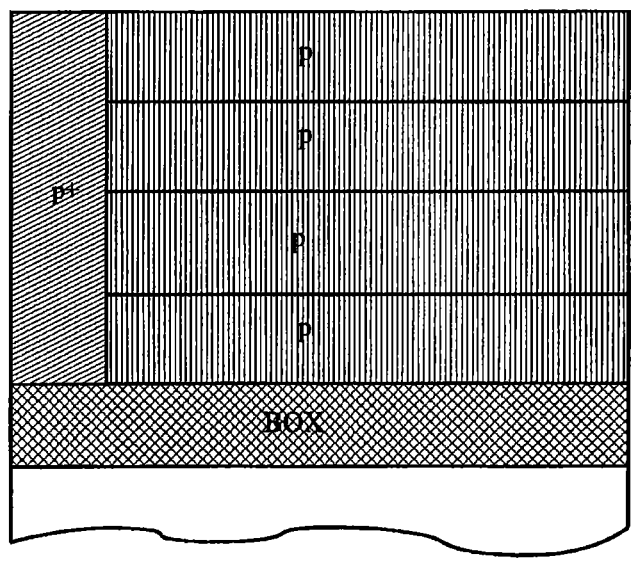
FIG. 21 shows a further cross sectional view of the embodiment of FIG. 20, similar to that of FIG. 8.

FIGS. 20 and 21 show cross sectional views of a further embodiment, similar to those of FIGS. 18 and 19. This again illustrates a case where the SJ structure has four layers. The SJ is located in the central region 12 of the termination portion, not illustrated in FIGS. 20 and 21. FIGS. 20 and 21 respectively show the structure of outer regions 14 and 13, where four n and p layers respectively are provided alongside the four layers of the SJ structure in central region 12.

Figure 22:
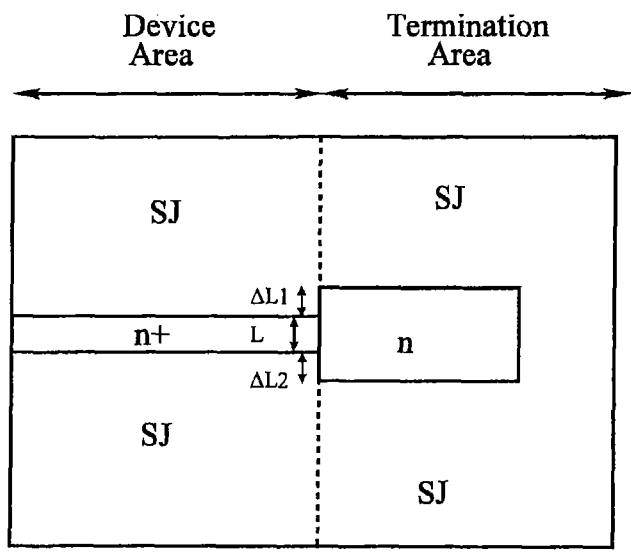
FIG. 22 shows a top view of a portion of a junction according to a further embodiment of the present invention.

FIG. 22 shows a top view of a portion of a junction according to a further embodiment. This is a variant of the FIG. 14/FIG. 27 embodiment. FIG. 22 shows the central n+ portion with SJ drift portion in the device area. The termination area also comprises a SJ. Whilst FIG. 27 shows portion 25 as having the same width as the n+ doped portion, the corresponding portion in FIG. 22 (labelled "n") has a greater width than the n+ doped portion. The width of the n+ doped portion is L, whereas the width of the n portion is $L+\Delta L1+\Delta L2$. $\Delta L1$ and $\Delta L2$ may be different or the same. One or both of $\Delta L1$ and $\Delta L2$ may also be negative (i.e. the n+ doped portion may be wider than, or offset from, the n portion. The order of magnitude of $\Delta L1$ and $\Delta L2$ is normally the same as that of L. In certain embodiments, $\Delta L1$ and $\Delta L2$ are each 50% or less than L. In other embodiments, $\Delta L1$ and $\Delta L2$ are each 25% or less than L.

Figure 23:
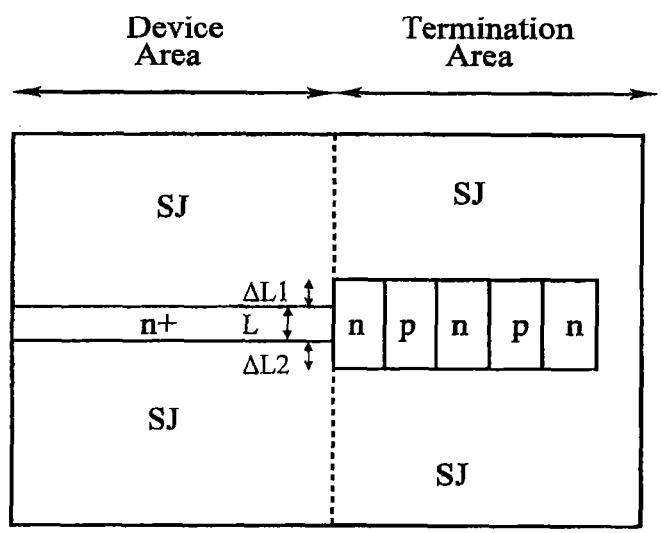
FIG. 23 shows a top view of a portion of a junction according to a further embodiment of the present invention.

FIG. 23 shows a top view of a portion of a junction according to a further embodiment. This is a variant of the FIG. 22 embodiment. Instead of the n doped portion of FIG. 22, an array of SJ islands is provided in the FIG. 23 embodiment.

Figure 26:
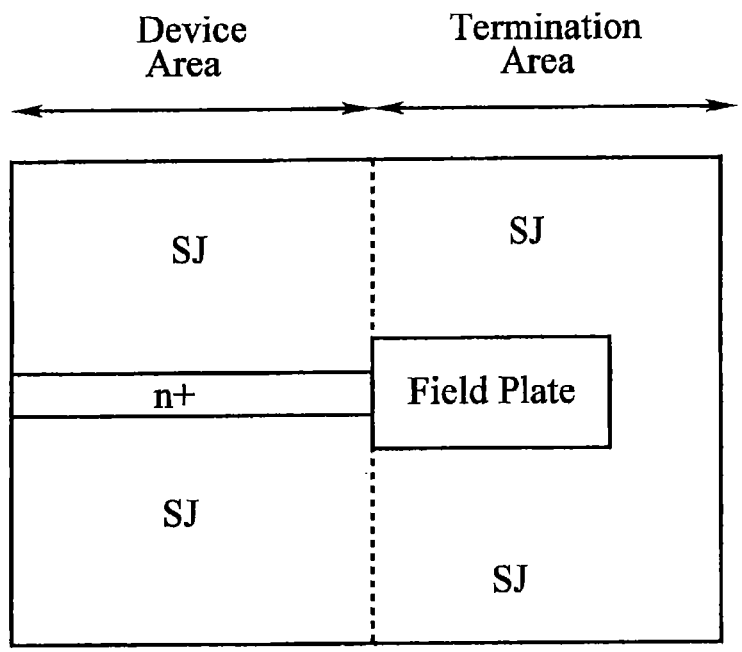
FIG. 26 shows a top view of a portion of a junction according to a further embodiment of the present invention.

FIG. 26 shows a top view of a portion of a junction according to a further embodiment. This is a variant of the FIG. 22 or FIG. 23 embodiments. As shown, a metal structure such as a field plate is provided in the FIG. 26 embodiment. This may be in addition to the n portion of FIG. 22 or the SJ island array of FIG. 23. The field plate or other metal structure can be formed in accordance with FIG. 12 or FIG. 13.

Figure 24:
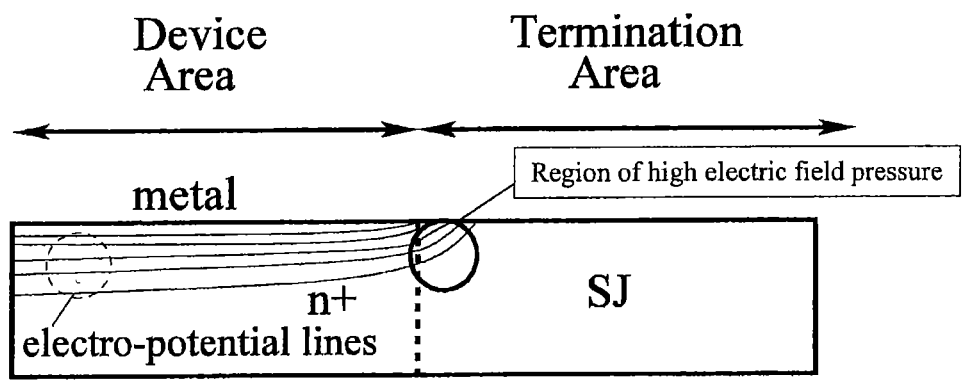
FIG. 24 shows a cross-sectional view of a portion of a Super Junction diode according to an embodiment of the present invention.
Figure 25:
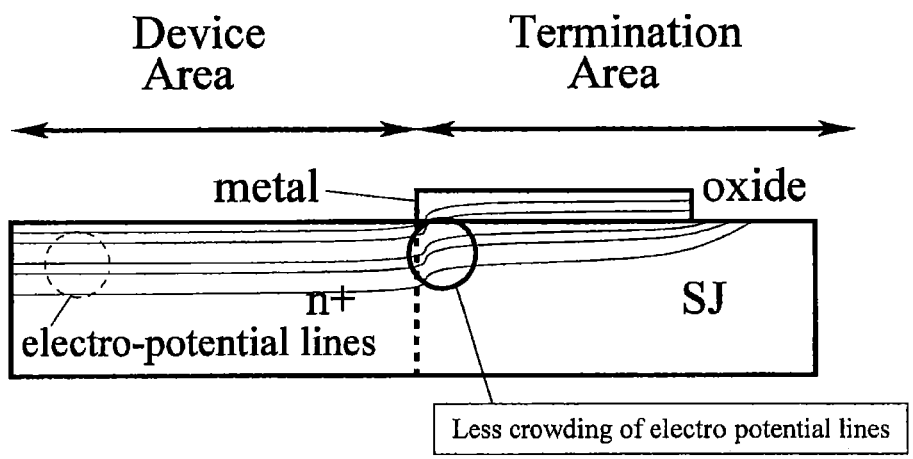
FIG. 25 shows a cross-sectional view of a portion of a variant of a Super Junction diode according to FIG. 24.

FIGS. 24 and 25 are intended to illustrate the function of the field plates (or other metal structure) as described above in more detail. FIG. 24 shows a cross section of a device similar to that of FIG. 6. A metal contact for n+ doped portion 7c is located on the top surface of the n+ doped portion. A possible distribution of electro-potential lines is shown. This distribution may result in relatively high electric field pressure in an area where the device area and the termination area meet.

FIG. 25 shows a cross section of a device similar to that of FIG. 24. A metal contact for n+ doped portion 7c is again located on the top surface of the n+ doped portion. However, this metal contact is "extended" by means of a structure which extends a short distance upwards and then across over a portion of the termination area. An oxide or other dielectric material can be used between the metal extension and the SJ material of the termination area to isolate the metal from the SJ. A possible distribution of electro-potential lines is shown. When compared with FIG. 24, the distribution of FIG. 25 may result in less crowding of electro-potential lines in an area where the device area and the termination area meet.

By way of summary of some features/embodiments disclosed herein, certain embodiments make use of junction isolation/termination for accommodating a specific reverse voltage. The device area of the semiconductor device is isolated from the substrate and surrounding devices as explained above.

The device area comprises high and low sides, i.e. regions of high conductivity that voltage signals are applied to. Embodiments of the invention allow the electric field distribution resulting from the applied voltages to be engineered in such a way that increased local peaks of the field strength can be avoided which might otherwise degrade and even break the device under operating conditions.

The termination region makes use of a Super Junction structure and doping so as to obtain a desired distribution of the potential lines. The doping levels used are of the appropriate level so as to provide a desired electric field distribution. The dimensions of, and distance between, different p/n layers can vary. An aim of certain embodiments is to provide alterations to actively shape the electric field at the interface of the device area and the termination region of the device, in particular in an area where the drift portion, the doped portions (p+ and n+) and the termination portion meet.

Portions 7a and 7c in the above embodiments may be heavily doped p+ and n+ regions, which is typical for a diode. However, these regions may also be p and n doped regions, as may be typical in case of a HV MOSFET, for example.

In embodiments disclosed herein the device does not necessarily need to have a symmetric layout. For example, islands as per variant (ii) may be provided at one side of the device but not at the other. Likewise, the additional metal structure as per variant (iii) may be provided at one side of the device but not at the other.

Forming the SJ in the termination region may make use of existing doping profiles (e.g. for forming the SJ in the device region), which may help to keep manufacturing costs low.

The skilled person will understand that in the preceding description and appended claims, positional terms such as 'above', 'overlap', 'under', 'lateral', 'vertical', etc. are made with reference to conceptual illustrations of semiconductor devices, such as those showing standard cross-sectional perspectives and those shown in the appended drawings. These terms are used for ease of reference but are not intended to be of limiting nature. These terms are therefore to be understood as referring to devices when in an orientation as shown in the accompanying drawings.

It will be appreciated that all doping polarities mentioned in the preceding description and appended claims could be reversed, the resulting devices still being in accordance with the present invention.

Although the invention has been described in terms of certain embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

What is claimed is:

1. A lateral semiconductor device comprising:
   a p or p+doped portion;
   an n or n+doped portion separated from the p or p+doped portion by a semiconductor drift portion; and
   at least one termination portion provided adjacent to the drift portion, wherein the at least one termination portion comprises a Super Junction structure, and wherein the Super Junction structure comprises alternating layers of n doped and p doped material, the alternating layers being formed on top of each other and the interfaces of the alternating layers being parallel to the surface of the semiconductor device.

2. A device according to claim 1, wherein said at least one termination portion comprises:
   a first region adjacent to the drift portion and comprising the Super Junction structure; and
   a second region associated with said at least one of the doped portions.

3. A device according to claim 2, wherein said second region is adjacent to, or extends laterally away from, said at least one of the doped portions.

4. A device according to claim 2, wherein said second region is arranged for significantly reducing the variation of the electric field strength in the region where said at least one termination portion and said at least one of the doped portions meet.

5. A device according to claim 4, wherein said second region comprises a doped semiconductor material whose doping is of the same polarity as the associated doped portion.

6. A device according to claim 5, wherein the drift portion and doped portions define a device region and wherein a second such termination portion is provided on the other side of the device region opposite the first termination portion.

7. A device according to claim 4, wherein said second region comprises:
   at least one layer of a first type, the first type of layer comprising semiconductor material whose doping is of the same polarity as the associated doped portion; and
   at least one layer of a second type, the second type of layer comprising alternating regions of p doped and n doped semiconductor material.

8. A device according to claim 7, wherein said second region comprises at least three layers selected from the first and second type of layers, wherein the at least three layers alternate between the first and second type.

9. A device according to claim 2, wherein the termination portion comprises a third region provided adjacent to, or extending laterally away from, the other doped portion.

10. A device according to claim 1, wherein the Super Junction structure comprises:
    at least one layer of p doped semiconductor material; and
    at least one layer of n doped semiconductor material.

11. A device according to claim 10, wherein the Super Junction structure comprises more than two alternating layers of n doped and p doped semiconductor material.

12. A device according to claim 1, comprising at least one metal structure associated with at least one of said doped portions, wherein said at least one metal structure covers at least a part of said at least one termination portion.

13. A device according to claim 12, wherein said at least one metal structure is arranged for significantly reducing the variation of the electric field strength in the region where the said at least one termination portion and said at least one of the doped portions meet.

14. A device according to claim 13, wherein said at least one metal structure is connected for being biased to the same voltage as the associated doped portion and is electrically insulated from said at least one termination portion and said drift portion.

15. A device according to claim 12, wherein a further such metal structure is provided, and wherein the further metal structure is associated with the other doped portion.

16. A device according to claim 12, wherein the drift portion and doped portions define a device region and wherein a second such termination portion and a second such metal structure is provided on the other side of the device region opposite the first termination portion.

17. A device according to claim 12, wherein said at least one metal structure comprises a plurality of field plates at different distances from the device surface, wherein a first one of said field plates which is located at a greater distance from the device surface than a second one of said field plates extends further over the termination portion than the second field plate.

18. A semiconductor device according to claim 1, wherein the device comprises at least two such doped portions of a first doping polarity arranged either side of another such doped portion of a second doping polarity, the second doping polarity being opposite to the first doping polarity, wherein said at least two doped portions of the first doping polarity are separated from said another doped portion by said drift portion.

19. A semiconductor device according to claim 18, wherein the at least two doped portions of the first doping polarity are arranged to be in electrical communication with each other.

20. A semiconductor device according to claim 18, wherein the device comprises at least two such doped portions of the second doping polarity, wherein the doped portions of the first and second doping polarities are arranged in alternating fashion.

21. A semiconductor device according to claim 20, comprising:
    a first rail wherein the at least two doped portions of the first doping polarity are in electrical communication with the first rail; and
    a second rail wherein the at least two doped portions of the second doping polarity are in electrical communication with the second rail.

22. A device according to claim 21, wherein the device further comprises a plurality of superjunction islands provided along at least a portion of the periphery of one or both of said rails.

23. A semiconductor device according to claim 21, wherein the first rail and the at least two doped portions of the first doping polarity form a first comb structure, and wherein the second rail and the at least two doped portions of the second doping polarity form a second comb structure.

24. A semiconductor device according to claim 23, wherein the termination portion comprises:
    a region associated with at least one of said doped portions, said region comprising either:
        a doped semiconductor material whose doping is of the same polarity as the associated doped portion; or
        at least one layer of a first type, the first type of layer comprising semiconductor material whose doping is of the same polarity as the associated doped portion, and at least one layer of a second type, the second type of layer comprising alternating regions of p doped and n doped semiconductor material.

25. A device according to claim 1, wherein the termination portion is formed outside the drift portion.

26. A device according to claim 1, wherein the width of the interface between the alternating layers is substantially equal to the width of each of the alternating layers.

* * * * *